United States Patent
Muralimanohar et al.

(10) Patent No.: US 8,990,646 B2
(45) Date of Patent: Mar. 24, 2015

(54) MEMORY ERROR TEST ROUTINE

(75) Inventors: Naveen Muralimanohar, Santa Clara, CA (US); Norman Paul Jouppi, Palo Alto, CA (US); Melvin K Benedict, Magnolia, TX (US); Andrew C. Walton, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 13/485,824

(22) Filed: May 31, 2012

(65) Prior Publication Data
US 2013/0326293 A1 Dec. 5, 2013

(51) Int. Cl.
| G11C 29/00 | (2006.01) |
| G11C 7/00 | (2006.01) |
| G11C 29/56 | (2006.01) |
| G11C 29/44 | (2006.01) |

(52) U.S. Cl.
CPC .......... *G11C 29/44* (2013.01); *G11C 29/56008* (2013.01)
USPC ............................ 714/723; 365/200; 365/201

(58) Field of Classification Search
None
See application file for complete search history.

(56) References Cited

U.S. PATENT DOCUMENTS

| 4,194,113 | A | * | 3/1980 | Fulks et al. .................... 714/732 |
| 4,964,129 | A | * | 10/1990 | Bowden et al. ............... 714/764 |
| 5,260,947 | A | * | 11/1993 | Posse ............................. 714/727 |
| 5,263,032 | A | * | 11/1993 | Porter et al. .................. 714/764 |
| 5,267,242 | A | * | 11/1993 | Lavallee et al. .............. 714/6.32 |
| 5,495,491 | A |   | 2/1996 | Snowden et al. |
| 7,089,461 | B2 |   | 8/2006 | Gilbert et al. |
| 7,240,277 | B2 |   | 7/2007 | Anderson et al. |
| 7,944,876 | B2 | * | 5/2011 | Mo ............................... 370/329 |
| 8,041,990 | B2 |   | 10/2011 | O'Connor et al. |
| 8,296,739 | B2 | * | 10/2012 | Kalla et al. .................... 717/127 |
| 2002/0016942 | A1 | * | 2/2002 | MacLaren et al. ............ 714/718 |
| 2006/0010352 | A1 | * | 1/2006 | Mukherjee et al. ............. 714/47 |
| 2006/0212778 | A1 | * | 9/2006 | Wheeler et al. ............... 714/764 |
| 2008/0104453 | A1 | * | 5/2008 | Mukherjee et al. ............ 714/47 |
| 2009/0125788 | A1 | * | 5/2009 | Wheeler et al. ............... 714/764 |
| 2011/0047440 | A1 |   | 2/2011 | Blackmon et al. |

* cited by examiner

*Primary Examiner* — Daniel McMahon
(74) *Attorney, Agent, or Firm* — Hewlett-Packard Patent Department

(57) ABSTRACT

An error test routine tests for a type of memory error by changing a content of a memory module. A memory handling procedure isolates the memory error in response to a positive outcome of the error test routine. The error test routine and memory handling procedure are to be performed at runtime transparent to an operating system. Information corresponding to isolating the memory error is stored.

15 Claims, 5 Drawing Sheets

MEMORY ERROR TEST ROUTINE

BACKGROUND

Memory, such as Dynamic Random Access Memory (DRAM), has become a major source of errors, particularly in data-heavy applications such as servers and datacenters. Techniques may be used to address error tolerance, such as chipkill level reliability (where a memory module is functional even if an entire DRAM device/chip in the module fails) and more aggressive error correction schemes such as double DRAM chip sparing, double device data correction, double chipkill (where a memory module will function even if two DRAM devices/chips in it fail), and chipkill with single bit error correction. However, such techniques are associated with deleterious effects, including high cost for increased DRAM redundancy (e.g., a need for a dedicated DRAM device/chip for storing error correcting code (ECC) per rank for chipkill error correction), high energy per access, and poor performance. Further, high fault tolerance requires accessing multiple DRAM memory modules to retrieve a single cacheline, which exacerbates over-fetch problems and increases energy needs per access. Most chipkill implementations cannot leverage more efficient ×16 or ×32 memory modules, and need less efficient ×4 or ×8 memory modules.

BRIEF DESCRIPTION OF THE DRAWINGS/FIGURES

DETAILED DESCRIPTION

Examples herein include proactively detecting and/or isolating memory failures, based on changing contents of memory to enable an understanding of error sources/manifestations and provide efficient error correction schemes for memory. Errors in memory (e.g., DRAM) can manifest in many ways: a single event failure both because of soft or hard errors, hard errors due to row failure and/or column failure in an array, channel failure, and pin failure. A hard error can manifest itself consistently in response to accessing the portion of memory associated with the failure. For example, a "1" may be written to a portion of memory, but a "0" may be read from that portion of memory instead of a "1." A soft error is transient, and may manifest itself inconsistently. When encountering an error, it is possible to rewrite to the faulty cacheline, to check whether the error is hard or soft. Additional mechanisms can enable understanding of the nature of errors, to provide a targeted solution. In an example, once "N" uncorrectable errors are encountered in a memory controller, an entire dual inline memory module (DIMM) may be replaced. Aggressive error correction such as chipkill or double chipkill can be used to avoid encountering uncorrectable errors, thereby delaying replacement. But with a failed row or column, it is possible to quickly reach the threshold of N uncorrectable errors. Other techniques can be used to proactively isolate, and reduce the occurrence of, more uncorrectable errors. Errors in channels can further complicate the situation. These errors may be correctable by adjusting the channel voltage or operating frequency, although test techniques may consider such errors to be DRAM hard errors.

Examples herein may explore additional information associated with the source of errors, and provide pointed solutions to the errors. For example, a memory controller may be used to categorize errors in DRAM. Once a hard error is encountered, the memory controller may initiate a routine to identify the cause(s) of the error(s), and log this information. The routines may be provided with almost zero impact to performance, because a majority of accesses are error free and the routines may be triggered initially by the detection of an error. In a system that frequently accesses faulty DRAM, this routine may be limited to every "N" hours, where N is either a preset value or can be configured through firmware and/or the memory controller. Such examples may provide proactive error isolation to reduce error correction requirements of DRAM and reduce power overhead associated with the DRAM.

Figure 1:
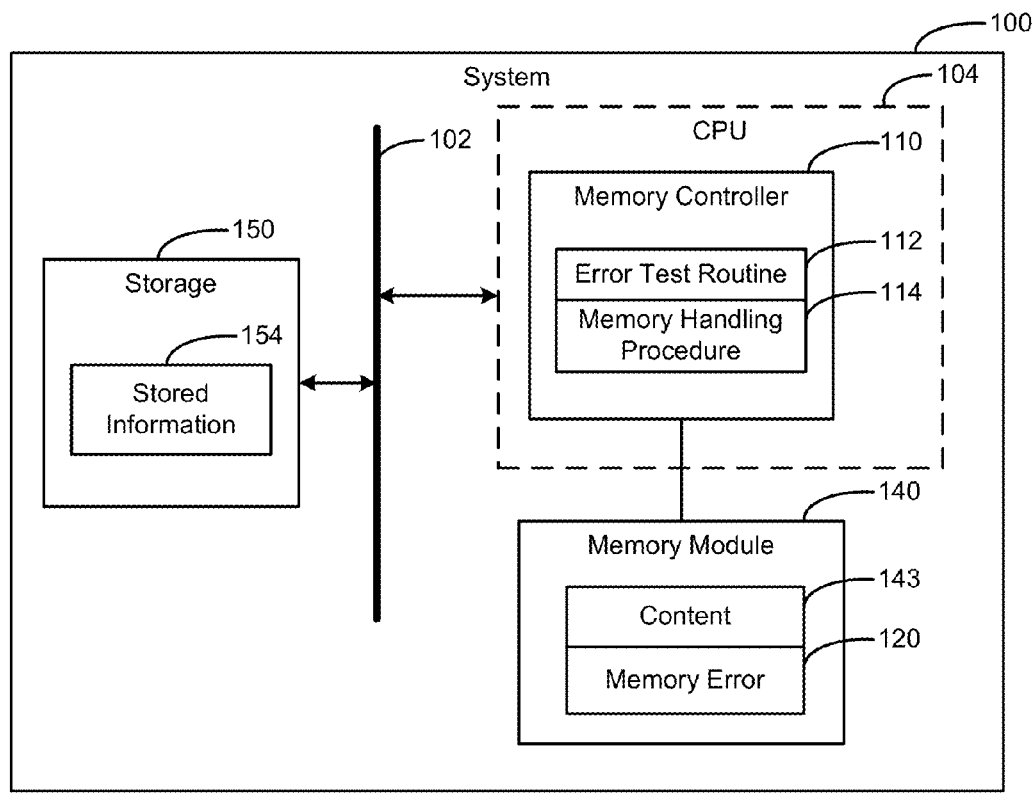
FIG. 1 is a block diagram of a system including a memory controller according to an example.

FIG. 1 is a block diagram of a system 100 including a memory controller 110 according to an example. The system 100 also includes memory module 140 and storage 150. The memory controller 110 may be provided separately, and may be included as part of at least one central processing unit (CPU) 104 or other processing module. The storage 150 and CPU 104 may interface with a system bus 102. The memory module 140 may be coupled to the memory controller 110 by a system bus or other bus (e.g., a memory bus). The memory controller 110 may be integrated onto other system components, such as being formed as part of a motherboard's northbridge, not shown. The memory controller 110 may include an error test routine 112 and memory handling procedure 114. The memory module 140 may include content 143 and one or more memory errors 120. The storage 150 may include stored information 154.

In an example, the memory controller 110 is to perform the error test routine 112, to test for a type of the memory error 120 by changing the content 143 of the memory module 140. The memory controller 110 also is to adjust the memory handling procedure 114 associated with the memory controller 110 to isolate the memory error 120 in response to a positive outcome of the error test routine 112. The memory controller 110 is to perform the error test routine 112 and adjust the memory handling procedure 114 at runtime transparent to an operating system. The storage 150 is to store information (stored information 154) corresponding to isolating the memory error 120.

In another example, the memory controller 110 is to perform a pin failure test, in response to an indication of a hard error associated with a failure pattern of a bank of a cacheline segment in a rank. The failure pattern may be associated with the memory error 120. In response to the pin failure test being negative, the memory controller 110 is to perform a channel failure test. In response to the pin failure test and the channel failure test being negative, the memory controller 110 is to perform a row failure test. In response to the pin failure test and the channel failure test being negative, the memory controller 110 is to perform a column failure test. The memory controller may perform these tests as part of the error test routine 112. The tests may be performed in series as described above, and also may be performed in parallel. A subset of these tests may be performed, and other tests not specifically shown also may be performed. One or more tests may be performed regardless of an outcome of another test. In response to a positive outcome of the error test routine 112, the memory controller 110 is to isolate the failure pattern of the memory error 120, based on adjusting the memory handling procedure 114 according to stored information 154 of storage 150.

The tests may be performed at runtime, transparently to the system 100, e.g., transparent to an operating system (OS). A system may continue running while an error is encountered and corrected, without a need for booting into a dedicated diagnostic mode/routine. A memory controller can, e.g., detect a single-bit error, and fix the error without needing to inform the OS that error detection and/or correction has taken place. An error test routine 112 may be initiated and carried out by the memory controller 110 without interfering with the memory usage by the OS. Thus, hardware such as the memory controller 110 may allow testing of memory and buffer contents, while exercising the memory. The examples described herein can look for patterns in software, in contrast to looking at hardware links, and are compatible with standard memory modules/connections (e.g., double data rate (DDR)/DIMM/ECC) without a need for non-standard memory formats. The memory controller 110 may initiate tests/routines to handle error conditions in response to software actions.

The source of errors and/or failed address lines/pages may be tracked as stored information 154 in storage 150. For example, stored information 154 may be firmware in communication with non-volatile storage 150, and the memory controller 110 may be a volatile buffer that may be transferred to the storage 150. The stored information 154 may serve as a signature for a particular memory configuration and/or memory module 140. There are multiple ways that firmware can deal with the errors, according to various implementations. Firmware can hide the affected region of memory in several ways, including marking known-bad pages in a Unified Extensible Firmware Interface (UEFI) memory map returned by a UEFI function call, such as UEFI GetMemoryMap( )returning EfiUnusableMemory. Similar function/call techniques may be used in the context of Advanced Configuration and Power Interface (ACPI) memory maps. Firmware also may pass messages to a health driver in the OS. The health driver can request that the OS map out bad regions as identified by the firmware, and keep track of what was mapped out on subsequent boots. Thus, the firmware/stored information 154 may be kept in non-volatile storage 150, to enable the system 100 to access the stored information 154 and keep track of known memory errors or other information pertaining to the memory module 140.

The stored information 154 may identify failed row/column addresses specific to a particular memory module 140. Thus, information associated with memory errors may be used as a signature that uniquely identifies a memory module 140. Thus, system 100 may, for example, identify whether stored information 154 corresponds to memory module 140, and determine whether memory module 140 has been replaced. Such signatures that uniquely identify memory modules 140 may be used to detect false warranty claims or memory module changes, based on identifying mismatches between the memory module 140 and the stored information 1540 collected by the system 100.

Figure 2:
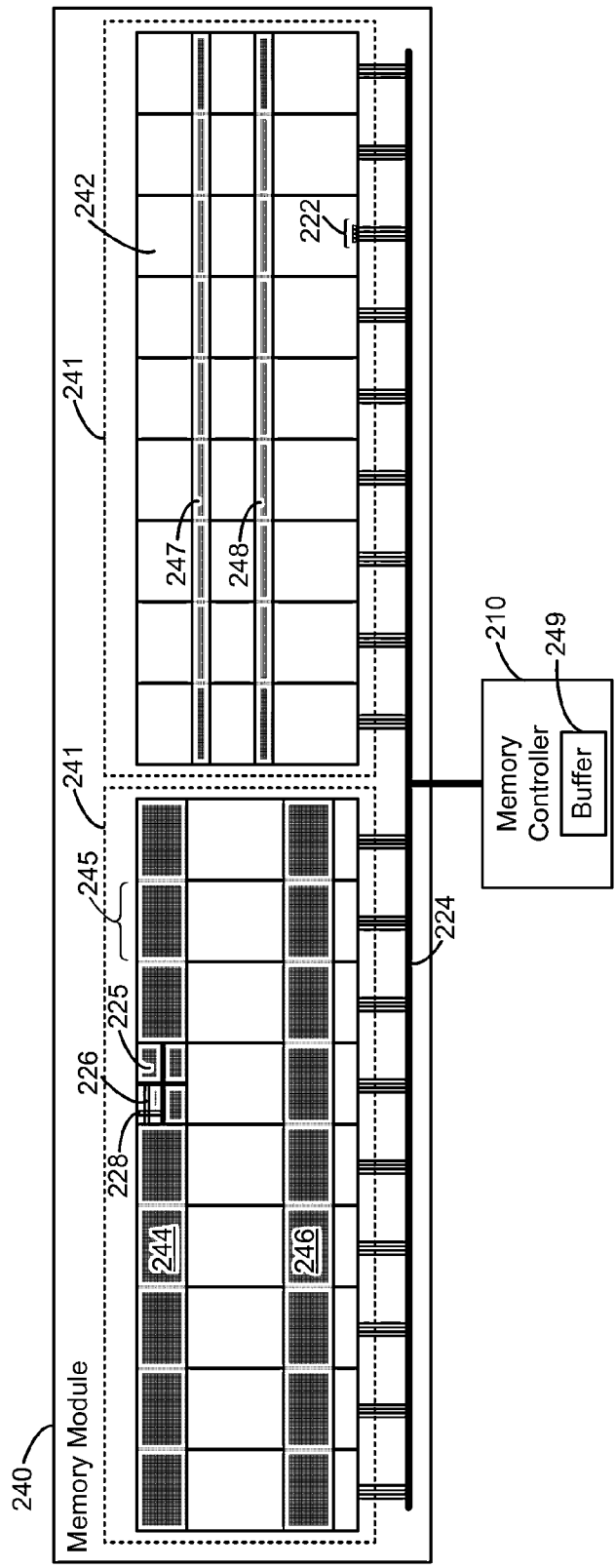
FIG. 2 is a block diagram of a memory module and memory controller according to an example.

FIG. 2 is a block diagram of a memory module 240 and memory controller 210 according to an example. The memory module 240 may include at least one channel 224 to interface with memory controller 210. The memory module 240 may be a Joint Electron Devices Engineering Council (JEDEC)-style double data rate (DDRx, where x=1, 2, 3, . . . ) memory module, such as a Synchronous Dynamic Random Access Memory (SDRAM) configured as a dual in-line memory module (DIMM). Each memory module 240 may include at least one rank 241 that may be activated in response to a memory request sent to the memory. A rank 241 may include a plurality of DRAM chips 242. Each chip 242 may include a plurality of pins 222 to interface with channel 224. Channel 224 may include any portion of an off-chip bus, such as a DDR bus, to connect pins 222 and memory controller 210. Although four pins 222 are shown for chip 242, each chip 242 may include various numbers of pins, such as 8-16 pins 222 or other numbers that may correspond to word size of the chip. Each pin 222 may be used to send multiple bits of data (e.g., sending multiple bursts of data in parallel). Two ranks 241 are shown for memory module 240, with each rank 241 shown including nine chips 242. Other numbers of ranks 241 and chips 242 may be used. A rank 241 may be divided into multiple banks (two are shown, first bank 244 and second bank 246, though other numbers of banks such as 4-16, may be used), each bank distributed across the chips 242 in a rank 241. Banks may enable parallelism, based on sending requests to different banks in parallel, keeping multiple banks busy simultaneously, depending on how cache blocks are mapped. A rank 241 may include a plurality of banks, e.g., 4-16 banks, spanning the chips 242. The portion of each rank 241/bank 244/246 associated with a chip 242 is a segment 245. Contents of the memory module 240 may be accessed via cachelines, such as first cacheline 247 and second cacheline 248. Memory requests may be associated with a granularity of a cacheline, such as 64 bytes, 128 bytes, or other values associated with a chosen memory controller architecture, system design, energy design constraints, and so on. When the memory controller 210 issues a request for a cacheline, the chips 242 in the rank 241 are activated and each segment 245 contributes a portion of the requested cacheline. Thus, a cacheline is striped across multiple chips 242.

In an example having a data bus width of 64 bits, and a cacheline of 64 bytes, the cacheline transfer can be realized based on a burst of 8 data transfers. A chip 242 may be an ×N part, e.g., ×4, ×8, ×16, ×32, etc. Each segment 245 of a bank 244/246 may be partitioned into N arrays 225 (four arrays are shown, indicating that chip 242 is a ×4 part). An array 225 can include a plurality of rows 226 and columns 228. Each array 225 can contribute a single bit to the N-bit transfer on the data I/O pins 222 of a chip 242.

Examples described herein impose no restrictions on DRAM parts, DIMM layout, DDR protocol, burst length, etc., and may be adapted to ×8, ×16, ×32, or other DRAMs, allowing servers to exploit advantages of those memory configurations. Examples may be achieved with non-intrusive modifications to system designs, because an example memory controller, and to a smaller extent a memory firmware, may be modified to provide support for the examples. Thus, examples herein provide benefits without a need for a custom-designed DRAM chip microarchitecture for identifying and handling memory errors.

The memory controller 210 may perform an error test routine based on use of a buffer 249, such as a logic buffer to facilitate changing contents of memory module 240. Although buffer 249 is shown as being included in memory controller 210, the buffer 249 may be a separate component between the memory module 240 and memory controller 210, may be included as part of the memory module 240, or may be included elsewhere in a system. In an example, buffer 249 may be provided as part of a DDR4 memory module 240 as part of a memory module error correction (not shown). Buffer 249 may be used to buffer memory contents from the memory module 240, allowing the memory controller 210 to alter the memory module 240 (e.g., overwrite its buffered contents) while keeping a copy of the memory contents safe in the buffer 249. It may happen that a request is received (e.g., requested by a processor such as a CPU) for a memory location that is being tested and held in the buffer 249. In an example, the request may be served from the buffer 249, thereby maintaining transparency even when testing/buffering. Additionally, memory requests and/or test requests may be associated with priority levels. In an example, during testing, processor memory requests may be given priority over test requests. By changing contents of the memory module 240, the memory controller 210 can determine additional information about a memory error. Logic support for the benefits described herein may be provided by the memory controller 240 in the form of hardware (structural modifications provided in silicon) and/or software (routines to be initiated).

An error test routine may be initiated in response to a check for a hard error, which may be performed by rewriting a faulty cacheline (such as first cacheline 247 and/or second cacheline 248) and reading it back. To test whether the hard error is caused by a pin failure, the memory controller may read data from a second bank 246 that is in the same rank 241 as the first bank 244. If the same set of bits fails each time, the error may be categorized as a pin failure, and techniques such as bit steering may be used to avoid using the pin(s) 222 associated with the error. The pin(s) 222 associated with the pin failure may be avoided by sending data through non-failed remaining one(s) of the pins 222. The channel 224, memory module 240, and/or memory controller 210 may include extra bits and/or lanes available for use when a failed pin 222 is identified. For example, accesses may be redirected to a spare rank 241 and the affected data may be copied to the spare rank 241. Thus, the pin failure test may enable memory module 240 to continue being used, without incrementing a count for uncorrectable errors.

The memory controller 210 may perform a test to check for channel failures. In an example, a channel failure test may be performed in response to a negative outcome of the above test for pin failure. The memory controller 210 may buffer (e.g., using buffer 249) a different cacheline (e.g., second cacheline 248) that is located in the same DRAM array 225 as the cacheline of the hard error. The data that resulted in the error may then be rewritten to the new location to check for errors. If the same set of errors exists, then the error is mostly due to data corruption in channels. The system (e.g., memory controller 210) may then perform mitigating operations to reduce likelihood of channel data corruption, e.g., lowering the DDR frequency and/or increasing the operating voltage to reduce or eliminate such channel failure errors. Thus, the channel failure test may enable memory module 240 to continue being used, without incrementing a count for uncorrectable errors.

The memory controller 210 may perform a test to check for row and/or column failures. In an example, row and/or column failure test(s) may be performed in response to a negative outcome of the above test for pin failure and/or channel failure. The memory controller 210 may read the contents of the faulty row 226 in to a temporary buffer 249. Following this, the memory controller 210 may write various patterns to the row 226, and read back the various patterns to check for row failure. To detect a column failure, a similar procedure is repeated for another cacheline 247/248 in the same column 228. Thus, the row and/or column failure test(s) may enable memory module 240 to continue being used, without incrementing a count for uncorrectable errors.

Examples provided herein may address frequent failure cases. For example, if failed memory is being accessed repeatedly, a system may avoid repeating a test and/or the error test routine for every access. For example, the error test routine and/or other runtime diagnostics may be limited to being performed once every interval N as set forth above. Further, an error test routine is not limited to any specific set of tests and/or order of testing. For example, if a symbol error is encountered, a system may perform all tests regardless whether the outcome of a particular test is positive or negative. Examples may include combinations of intervals and/or variations in application of a given test in an error test routine. An interval may be applied globally to an entire test routine, and may be applied selectively to particular test(s) in a given error test routine.

Figure 3:
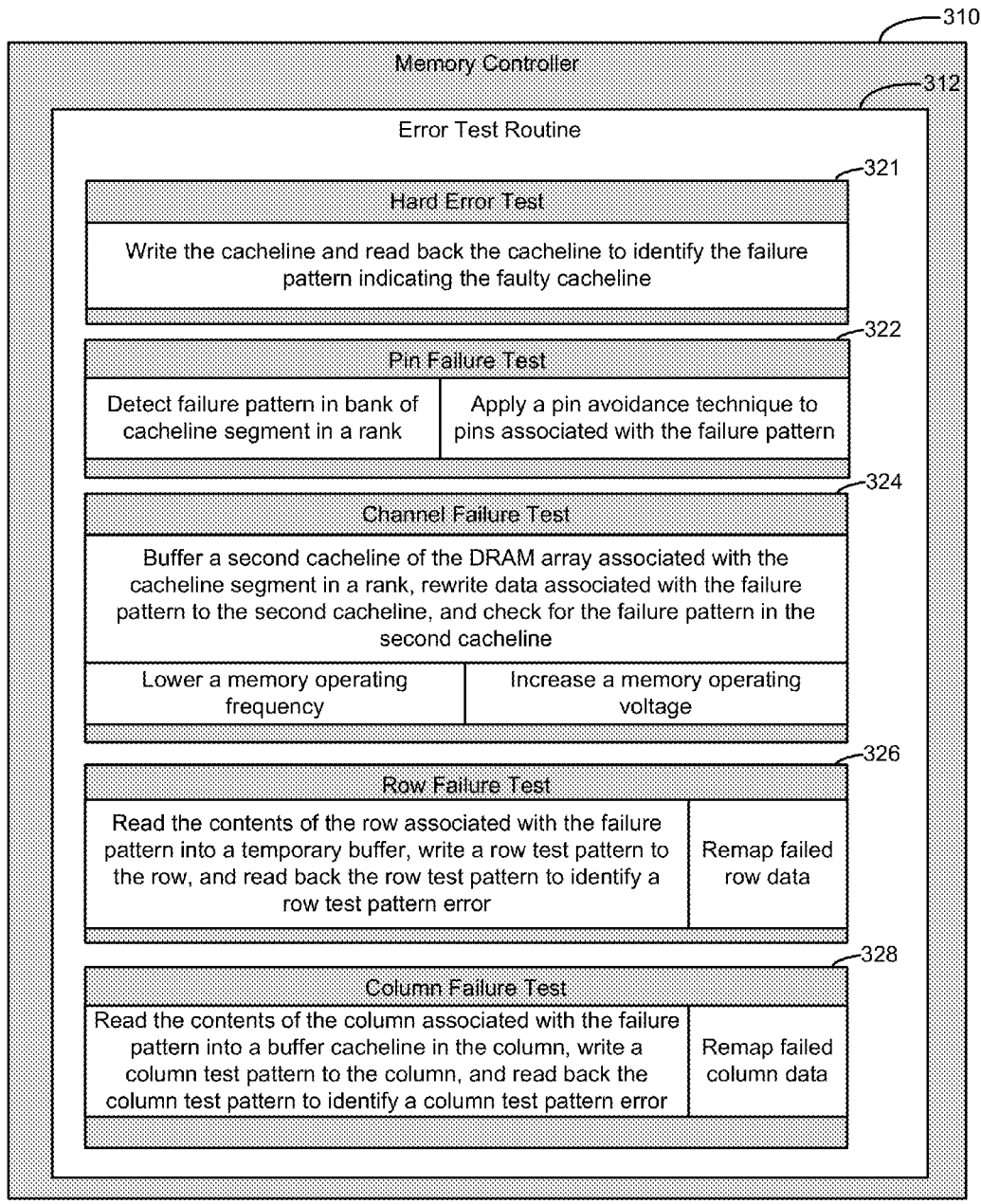
FIG. 3 is a block diagram of a memory controller and error test routine according to an example.

FIG. 3 is a block diagram of a memory controller 310 and error test routine 312 according to an example. The error test routine 312 may include various tests, and is shown with hard error test 321, pin failure test 322, channel failure test 324, row failure test 326, and column failure test 328. The error test routine 312 may involve performing one test and/or all tests.

The hard error test 321 may identify that an error exists. In an example, the hard error test 321 may involve writing a cacheline and reading back the cacheline to identify a failure pattern indicating that the cacheline is faulty.

The pin failure test 322 may identify whether the error is associated with a failed pin. In an example, the pin failure test 322 is to detect a failure pattern in a bank of a cacheline segment in a rank. In response to identifying a pin failure, the pin failure test 322 may cause the memory controller 310 to apply a pin avoidance technique to pins associated with the failure pattern.

The channel failure test 324 may identify whether the error is associated with a failed channel. In an example, the channel failure test 324 is to buffer a second cacheline of the DRAM array associated with the cacheline segment in a rank, rewrite data associated with the failure pattern to the second cacheline, and check for the failure pattern in the second cacheline. In response to identifying a channel failure, the channel failure test 324 may cause a memory controller to lower a memory operating frequency and/or increase a memory operating voltage.

The row failure test 326 may identify whether the error is associated with a failed row. In an example, the row failure test 326 is to read the contents of the row associated with the failure pattern into a temporary buffer, write a row test pattern to the row, and read back the row test pattern to identify a row test pattern error. In response to identifying a row failure, the row failure test 326 may cause the memory controller to remap the failed row data.

The column failure test 328 may identify whether the error is associated with a failed column. In an example, the column failure test 328 is to read the contents of the column associated with the failure pattern into a buffer cacheline in the column, write a column test pattern to the column, and read back the column test pattern to identify a column test pattern error. In response to identifying a column failure, the column failure test 328 may cause the memory controller to remap the failed column data.

The tests associated with the error test routine 312 may be implemented in firmware as various routines to be executed by the memory controller 310. The firmware, and any information collected as part of the error test routine 312, may be stored in non-volatile memory to be accessible between system reboots.

Figure 4:
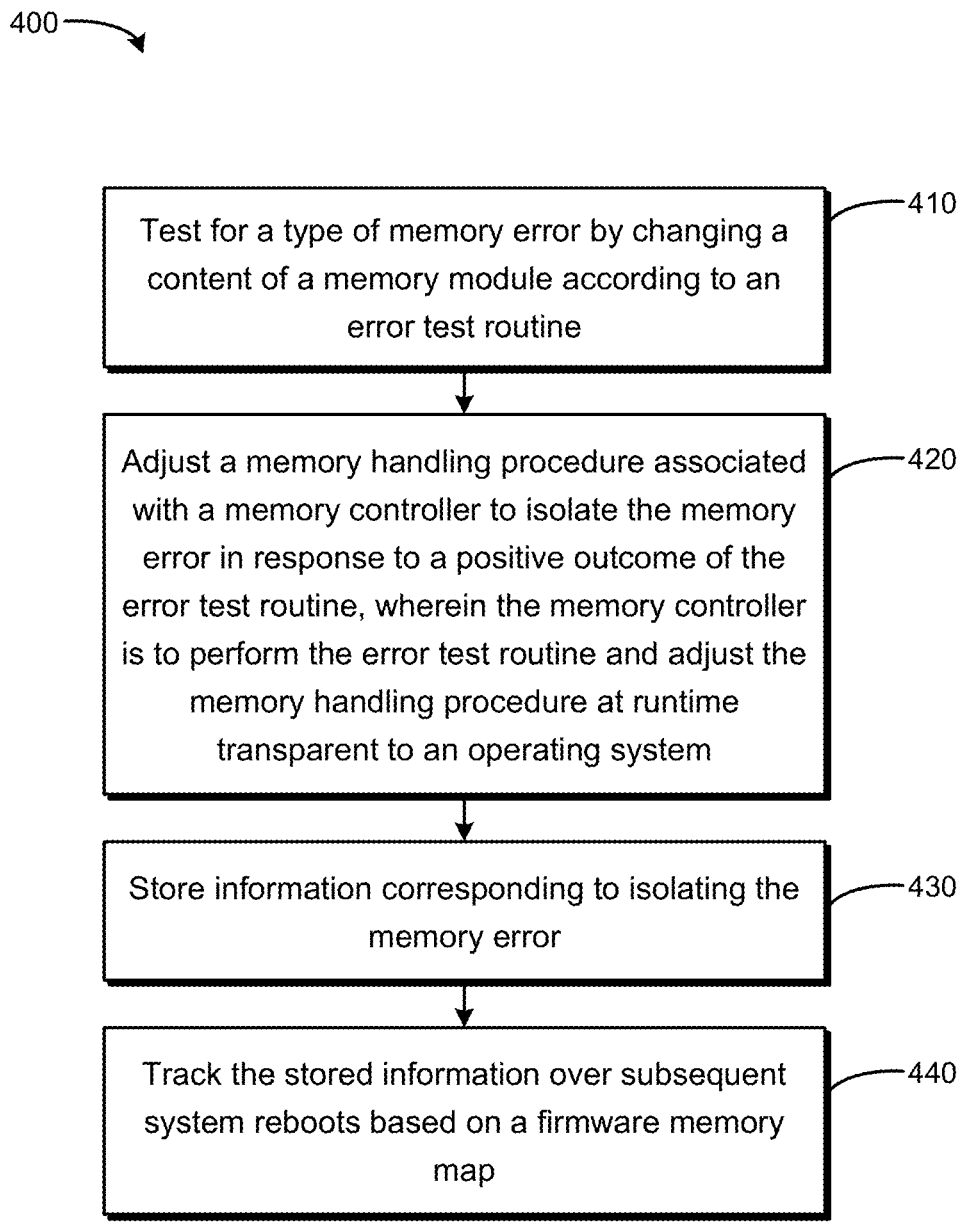
FIG. 4 is a flow chart based on testing for a type of memory error according to an example.

FIG. 4 is a flow chart 400 based on testing for a type of memory error according to an example. In block 410, a type of memory error is tested for by changing a content of a memory module according to an error test routine. For example, a portion of memory may be buffered and/or written to another portion of memory to see what errors may result. In block 420, a memory handling procedure associated with a memory controller is adjusted to isolate the memory error in response to a positive outcome of the error test routine, wherein the memory controller is to perform the error test routine and adjust the memory handling procedure at runtime transparent to an operating system. In block 430, information corresponding to isolating the memory error is stored. In block 440, the stored information is tracked over subsequent system reboots based on a firmware memory map.

Figure 5:
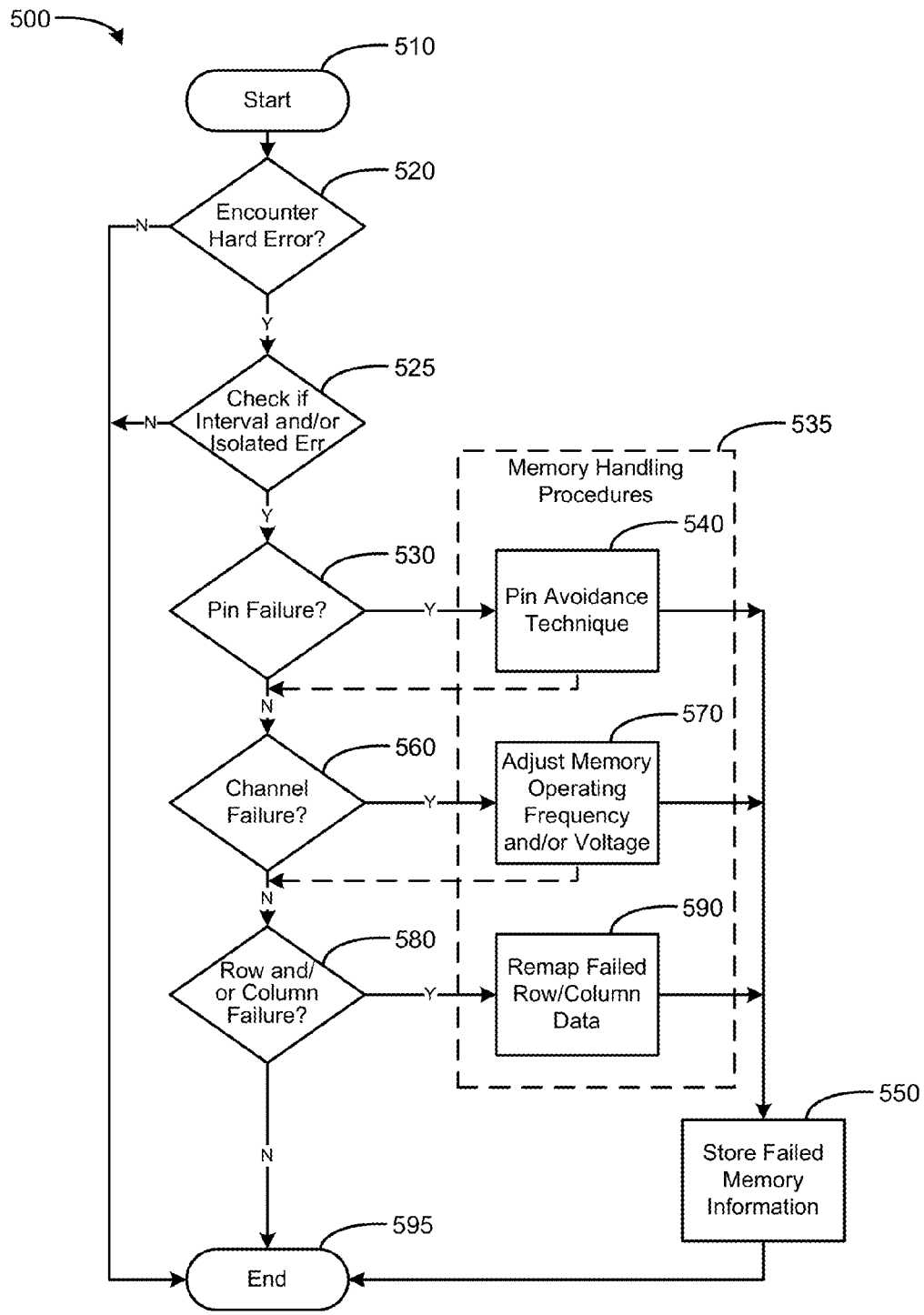
FIG. 5 is a flow chart based on encountering a hard error according to an example.

FIG. 5 is a flow chart 500 based on encountering a hard error according to an example. The flow chart 500 starts at block 510. In block 520, it is determined whether a hard error is encountered. If not, flow ends at block 595. If a hard error is encountered, flow proceeds to block 525. In block 525, a check is performed regarding an interval and/or an isolated error. For example, a system may bypass the error test routine until a specified interval has passed, thereby performing the error test routine at a variable frequency. A system may encounter a hard error and identify that a failure pattern has already been isolated corresponding to the hard error, such that there is no need to perform another test for that same hard error. Thus, the error test routine may be bypassed based on whether an interval has passed and/or whether the encountered hard error has already been encountered and/or isolated, e.g., in a frequent failure case. If bypassing the error test routine, flow proceeds to end at block 595. If not bypassing, flow proceeds to perform the error test routine (e.g., flow proceeds to any of blocks 530, 560, and/or 580, which may be performed selectively, in series, and/or in parallel). In block 530, it is determined whether a pin failure is encountered. If no pin failure, flow proceeds to block 560 to determine whether a channel failure is encountered. If no channel failure, flow proceeds to block 580 to determine whether a row and/or column failure is encountered. In alternate examples, block 580 may be split into separate row and column test blocks. If no row and/or column failure, flow ends at block 595. If any of blocks 530, 560, or 580 result in a positive outcome, flow proceeds to one or more corresponding memory handling procedures 535. For example, in block 540, a pin avoidance technique may be used in response to a positive outcome of the pin failure block 530. In block 570, memory operating frequency and/or voltage may be adjusted in response to a positive outcome of the channel failure block 560. Upon a positive outcome of a test, flow may return to perform an additional test, e.g., represented by the dashed lines leading from block 540 and/or 570. In alternate examples, the tests may be performed in any order, and a test may be performed or not performed, regardless of an outcome of a test. In block 590, failed row and/or column data may be remapped in response to a positive outcome of the row and/or column failure block 580. After executing the memory handling procedure(s) 535, flow proceeds to block 550, upon which failed memory information is stored and flow ends at block 595.

It is appreciated that the previous description of the disclosed examples is provided to enable any person skilled in the art to make or use the present disclosure. Various modifications to these examples may be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A system comprising:
a memory controller to perform an error test routine in response to encountering a memory error, to test for a type of the memory error by changing a content of a memory module to identify a failure pattern, based on writing a cacheline and reading back the cacheline, indicating that the type of the memory error is a hard memory error and identifying which of a plurality of types of hard memory failures caused the hard memory error based on performing at least a pin failure test and a channel failure test, and to adjust a memory handling procedure associated with the memory controller to isolate the memory error in response to a positive outcome of the error test routine, wherein the memory controller is to perform the error test routine and adjust the memory handling procedure at runtime transparent to an operating system; and
a storage to store information corresponding to isolating the memory error.

2. The system of claim 1, wherein the error test routine includes testing for the type of the memory error based on at least one of: a pin failure test, a channel failure test, a row failure test, and a column failure test.

3. The system of claim 1, wherein the memory controller is to read the stored information, and isolate the memory error based on the stored information, wherein the stored information is persistent across system reboots.

4. The system of claim 1, wherein the memory controller is to generate a memory signature to identify the memory module, based on the stored information.

5. A system comprising:
a memory controller to test for a type of memory error by changing a content of a memory module according to an error test routine, performed at runtime transparent to an operating system in response to an indication of a hard error associated with a failure pattern of a bank of a cacheline segment in a rank, wherein the memory controller is to:
perform a pin failure test;
perform a channel failure test;
perform a row failure test;
perform a column failure test; and
isolate the failure pattern, in response to a positive outcome of the error test routine, based on adjusting a memory handling procedure according to stored information of a storage.

6. The system of claim 5, wherein the memory controller is to bypass the error test routine based on at least one of an interval and an identification of an isolated failure pattern corresponding to the indication of the hard error.

7. The system of claim 5, wherein in response to the pin failure test being positive, the memory controller is to apply a pin avoidance technique to at least one pin associated with the failure pattern.

8. The system of claim 7, wherein the pin avoidance technique is to copy data, affected by the at least one pin associated with the failure pattern, from an affected memory to a spare memory, and redirect accesses from the affected memory to the spare memory.

9. The system of claim 5, wherein the memory controller is to perform the channel failure test based on buffering a test cacheline of a DRAM array associated with the cacheline segment in the rank, rewriting data associated with the failure pattern to the test cacheline, and checking for the failure pattern in the test cacheline.

10. The system of claim 5, wherein in response to the channel failure test being positive, the memory controller is to perform at least one of lowering a memory operating frequency or increasing a memory operating voltage.

11. The system of claim 5, wherein the memory controller is to perform the row failure test based on reading contents of a row associated with the failure pattern into a temporary buffer, writing a row test pattern to the row, and reading back the row test pattern to identify a row test pattern error.

12. The system of claim 5, wherein the memory controller is to perform the column failure test based on reading contents of a column, associated with the failure pattern, into a buffer cacheline in the column, writing a column test pattern to the column, and reading back the column test pattern to identify a column test pattern error.

13. A method, comprising:
   testing, in response to encountering a memory error, for a type of the memory error by changing a content of a memory module, according to an error test routine, to identify a failure pattern, based on writing a cacheline and reading back the cacheline, indicating that the type of the memory error is a hard memory error and identifying which of a plurality of types of hard memory failures caused the hard memory error based on performing at least a pin failure test and a channel failure test;
   adjusting a memory handling procedure associated with a memory controller to isolate the memory error in response to a positive outcome of the error test routine, wherein the memory controller is to perform the error test routine and adjust the memory handling procedure at runtime transparent to an operating system; and
   storing information corresponding to isolating the memory error.

14. The method of claim 13, wherein information is stored based on a firmware memory map readable by an operating system driver to track the firmware memory map over subsequent system reboots.

15. The method of claim 13, further comprising buffering information to test for the memory error, based on a buffer of a memory module.

* * * * *